United States Patent [19]
Flamholz et al.

[11] Patent Number: 5,268,951
[45] Date of Patent: Dec. 7, 1993

[54] X-RAY BEAM SCANNING METHOD FOR PRODUCING LOW DISTORTION OR CONSTANT DISTORTION IN X-RAY PROXIMITY PRINTING

[75] Inventors: Alexander L. Flamholz, Monsey; Robert P. Rippstein, Hopewell Junction; Jerome P. Silverman, White Plains, all of N.Y.; Matthew A. Thompson, Austin, Tex.

[73] Assignee: International Business Machines Corporation, Armonk, N.Y.

[21] Appl. No.: 994,744

[22] Filed: Dec. 22, 1992

[51] Int. Cl.$^5$ ............................................. G21K 5/00
[52] U.S. Cl. ......................................... 378/34; 378/85
[58] Field of Search .................................. 378/34, 85

[56] References Cited

U.S. PATENT DOCUMENTS

| | | | |
|---|---|---|---|
| 4,803,713 | 2/1989 | Fujii | 378/34 |
| 4,984,259 | 1/1991 | Itow et al. | 378/146 |
| 5,031,199 | 7/1991 | Cole et al. | 378/34 |
| 5,077,774 | 12/1991 | Piestrup et al. | 378/179 |

OTHER PUBLICATIONS

J. P. Silverman, et al., "Synchrotron radiation X-ray lithography: recent results" SPIE vol. 448, pp. 50–59, 1984.

R. P. Haelbich, "Optimization of the optics matching a storage ring to an X-ray lithography camera" SPIE vol. 448, pp. 93–101, 1984.

E. Cullmann, et al. "An X-ray stepper for production lithography" SPIE vol. 773, pp. 2–6, 1987.

*Primary Examiner*—Craig E. Church
*Attorney, Agent, or Firm*—Graham S. Jones, II; Charles W. Peterson, Jr.

[57] ABSTRACT

A x-ray scanning method involves the stops of directing an x-ray beam at a collimating first mirror having the capability of altering the source to mirror location and/or grazing angle of incidence. The beam is then reflected from a flat second mirror capable of a scanning motion by linear translation with an optional accompanying angular change in the grazing angle of incidence of the beam on the second mirror.

3 Claims, 2 Drawing Sheets

X-RAY BEAM SCANNING METHOD FOR PRODUCING LOW DISTORTION OR CONSTANT DISTORTION IN X-RAY PROXIMITY PRINTING

BACKGROUND OF THE INVENTION

1. Field of the Invention

This invention relates to an X-ray exposure apparatus for printing a fine pattern such as a semiconductor integrated circuit pattern or the like. More particularly, the invention is concerned with an optical system including a method for scanning an X-ray beam in an X-ray exposure apparatus using synchrotron radiation or the like as a source.

2. Description of related art.

In recent years, synchrotron radiation (hereinafter referred to as SR) has become a promising source for the X-ray exposure apparatus. SR is electromagnetic radiation generated by high energy electrons which run along a circular orbit at a velocity close to the speed of light. SR is emitted in the direction tangential to the orbit and features excellent directivity and high intensity in the wavelength range of about 0.5 to 1.5 nm usually used in the X-ray exposure apparatus. While SR is emitted uniformly in the horizontal plane (orbital plane of electrons), the divergence angle of the component whose wavelength is useful for X-ray exposure is at most 1 milliradian in a vertical plane (the plane extending orthogonally to the orbital plane and in parallel with a predetermined plane. Accordingly in order to expose a fixed object placed at approximate 12 meters from the SR light source over a square field having a side of several tens millimeters, the object must be scanned in the vertical direction by deflecting the SR.

To this end, a rotatable reflecting mirror is used in an SR beam scanning system described in "Proceeding of SPIE - The International Society for Optical Engineering", Vol. 448, pp. 93-101. It shows an arrangement of this known optical system in a plane orthogonal to the orbital plane of electrons. The beam emitted from an SR source is deflected by a reflecting mirror to a mask and a wafer held with a gap of several tens of $\mu$m therebetween, whereby the pattern of the mask is printed on the wafer. For the sake of convenience, the combination of the mask and the wafer will collectively be termed an object in the following description. The reflecting surface of the mirror is implemented in a cylindrical form ("U" form) to collimate the in the horizontal direction. The reflecting mirror can be rotated about, the axis extending perpendicularly to the plane within an angular range da of about ±3 mrad relative to the center position where the grazing incidence angle a (i.e. angle formed between the incident beam and the reflecting surface) is 24 mrad. As a result, the object located at about 7 m from the reflecting mirror is scanned with the beam over a width of about 40 mm. On the other hand, in the horizontal plane (orthogonal to the plane of the drawing), the SR beam is collimated by a concave reflecting surface, whereby a beam width of about 40 mm is obtained on the object.

The beam intensity varies along with the position on the object, giving rise to a first problem that line width control in the resist pattern becomes difficult.

See E. Cullman, K. A. Cooper, and W. Vach, "An X-ray Stepper for Production Lithography" SPIE Proc. Vol. 773 Electron-Beam, X-Ray and Ion-Beam Lithographies VI, pp. 2-6 (1987).

The conventional method for scanning an x-ray beam across an exposure field is to alter the grazing angle of incidence of a collimating mirror. This results in altering the mirror collimation producing printing distortion for an x-ray proximity printed image on a wafer and introducing non-uniform exposure intensity.

In x-ray proximity printing using synchrotron orbital radiation, the x-ray flux emitted by the source is typically collimated by one or more x-ray grazing incidence mirrors such that a maximum of useful flux is delivered to the mask and such that the x-rays arrive at the mask normal to the surface to eliminate geometric printing distortion. The geometric distortion D is given by:

$$D = Gap \times Tan\, A$$

where
Gap on the order of 10 $\mu$M to 50 $\mu$M and
A less than 1 milliradian (mrad) for typical mirror systems.

Mirror grazing incidence angles are chosen which, combined with the mirror surface material, provide an acceptable reflectivity for x-ray radiation. Typical grazing angles are in the order of 1 to 2 degrees and a typical mirror reflectivity of 70% is available from a gold surface for wavelengths in the 8 to 12 Å range. Once a grazing angle of incidence and a source to mirror distance are selected the mirror focal length 'F' is defined (equal to the source to mirror distance for a collimating mirror) and a surface form is chosen which yields acceptable collimation over a given exposure field width. Typical mirror surface forms are cylindrical, toroidal, elliptical, and parabolic with the toroidal shape being the most common due to ease of manufacture and lower cost. If the mirror location with respect to the source or grazing angle of incidence is changed, the collimation of the beam changes as well as the flux per unit horizontal length at the exposure field, both producing adverse proximity printing results.

Several options are available to expose the full mask field. Since the horizontal field size is typically determined by the source to mirror distance, the mirror surface form, and the degree of acceptable collimation error, the task is reduced to covering a desired vertical field size. This is done either by as follows:

(1) moving the mask and wafer pair through the stationary x-ray beam or
(2) moving the x-ray beam across the stationary mask and wafer pair.

It is now believed that the most accurate mask to wafer registration will be achieved for the case where the mask and wafer are stationary, due to the difficulties in maintaining alignment between mask and wafer stages during vertical acceleration and scanning. The preserved option is to scan the x-ray beam across the vertical exposure field.

The most commonly used method to scan the x-rays across the exposure field is to alter the mirror grazing angle to produce the desired shift at the mask. The errors resulting from this form of scanning are:

1. A change in the beam collimation, typically separated into the horizontal (Xphase) and vertical (Zphase) error components.
2. A change in the exposure intensity through the field due to the collimation error and changes in the reflectivity of the mirror with grazing angle.

The merits of various mirror forms in reducing these errors is discussed in J. P. Silverman, R. P. Haelbich, and J. M. Warlaumont, "Synchrotron Radiation X-ray Lithography: Recent Results", SPIE Proc. Vol. 488, pages 50-59 (1984.)

U.S. Pat. No. 5,077,774, Piestrup, et. al., "X-ray lithography Source", Col. 18, see lines 2-46 describing, in an x-ray source, a grazing angle reflector which is wobbled comprising a flat or slightly curve x-ray mirror which reflects a diverging x-ray beam. The divergence of the x-ray beam introduces an "overlay error (increased shadowing of the circuit of the mask on the resist)."

U.S. Pat. No. 5,031,199, Cole, et. al., "X-ray Lithography Beamline Method and apparatus" describes a beamline apparatus for X-ray lithography which receives synchrotron radiation. The apparatus comprises a first, entrance mirror in the beamline with a reflecting surface which is concave along its width and concave along its length, positioned to receive the fan of radiation from a synchrotron at a grazing angle and to partially collimate the X-rays in one dimension. In addition, a second, refocusing mirror is positioned to receive the X-rays reflected from the entrance mirror at a grazing angle. The refocusing mirror has a reflecting surface which is concave along its length and convex along its width. The refocusing mirror acts to collimate the X-rays horizontally and to focus the X-rays vertically, the entrance mirror and the refocusing mirror positioned to cooperate to provide a beam having a substantially uniform image at an image plane with a substantially uniform power distribution. The entrance mirror and the refocusing mirror each have a grazing angle to the X-rays of approximately 2 degrees. The apparatus includes a structure for enclosing the beamline along its length including the entrance and refocusing mirrors and a window closing the end of the beamline to seal the interior of the beamline from the external atmosphere and to cooperate with the entrance and refocusing mirrors to provide an X-ray beam as passed through the window having X-rays above and below a desired energy band substantially attenuated.

U.S. Pat. No. 4,984,259 Jan. 8, 1991 of Itou et al for "X-ray Exposure Apparatus" describes an X-ray exposure apparatus comprising an X-ray source, a reflecting mirror for deflecting an X-ray beam radiated from the X-ray source to an object, and mechanisms for rotating the reflecting mirror about an axis of rotation apart from a reflecting surface of the reflecting mirror. The reflecting mirror has such a shape that the angle of incidence remains constant relative to the X-ray beam at given angles of rotation. The X-ray exposure apparatus comprises: an X-ray source; a reflecting mirror having a reflecting surface for deflecting an X-ray beam radiated from the X-ray source to an object; means for rotating the reflecting mirror having the reflecting surface about an axis of rotation, the axis of rotation being disposed apart from the reflecting surface; the reflecting surface being configured with a shape so that an angle of grazing incidence of the X-ray beam is maintained at a constant value when the reflecting mirror rotates about the axis of rotation; and means for scanning the object with the X-ray beam by rotating the reflecting mirror about the axis of rotation by means of the rotating means. A purpose of the Itou patent was to provide a beam scanning system for an X-ray exposure apparatus in which the beam intensity and the incident direction on the object can always be held constant in the course of scanning of an object with a SR beam by means of a simple rotating mechanism.

An object of this invention is to allow scanning of an x-ray beam across an exposure field while avoiding the introduction of printing distortion and non-uniform exposure, and with capability of producing deliberate printing distortion independently in the vertical and horizontal exposure axes.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The scanning method in accordance with this invention avoids distortion errors by means of the steps as follows:

1. A collimating first mirror has the capability of altering the source to mirror location and/or grazing angle of incidence.
2. A flat second mirror is capable of a scanning motion by translation with an optional accompanying change in the grazing angle of incidence.

This invention employs a scanning method which greatly reduces or eliminates mirror scanning errors while presenting the possibility of producing a constant distortion (zero to some value determined by mask/wafer overlay distortion correction), a minimum of flux change throughout vertical scanning, and a nearly constant x-ray beam profile during scanning. The technique is independent of collimating mirror surface form.

Alternative Mirror Scanning Method

Figure 1A:
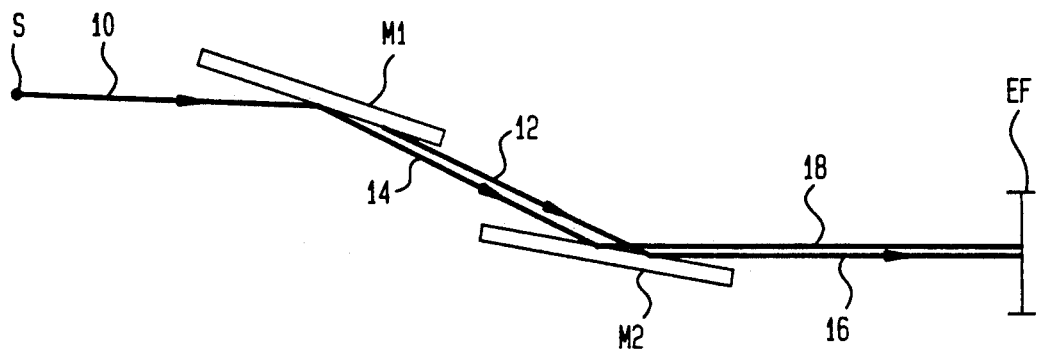
FIGS. 1A-1C illustrate the basic principle involved in maintaining collimation and performing vertical scanning by shifting a flat collimating mirror parallel to an exposure field or along an input beam to a flat second mirror.
Figure 1B:
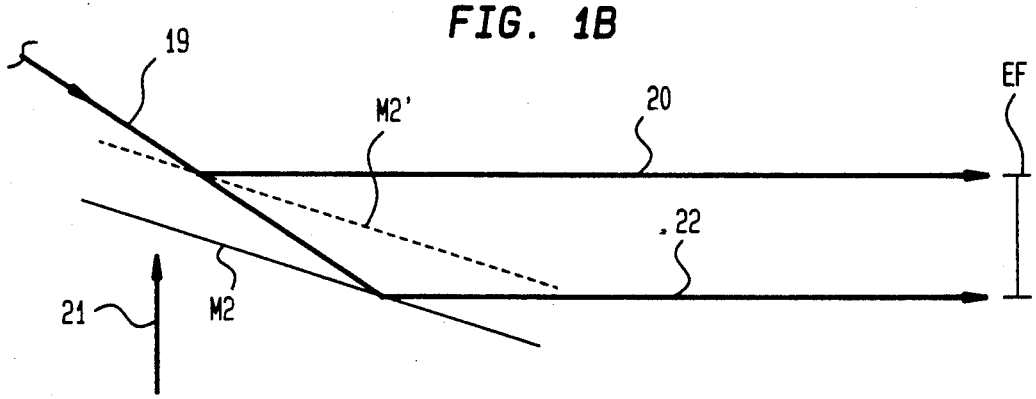
Figure 1C:
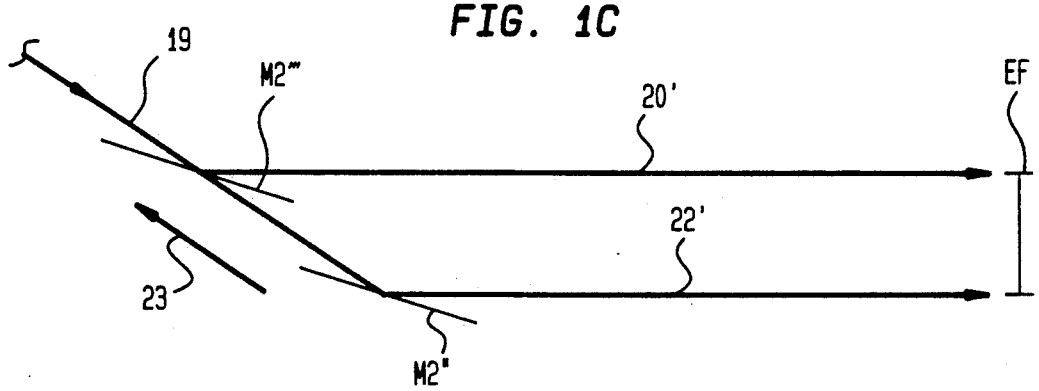

The alternative scanning method requires a second, flat, grazing incidence mirror M2 which is placed after the first, collimating, mirror M1. FIGS. 1A-1C illustrate the basic principle involved in maintaining collimation and performing vertical scanning by shifting the flat collimating mirror M1 parallel to the exposure field or along the input beam to the flat second mirror M2 (to minimize the length of the second mirror M2). The x-ray radiation beam 10 from source S is reflected over a range shown by beams 12 and 14 from the first mirror M1 and reflected by second mirror M2 as beams 16 and 18 which are directed at exposure field EF. Combinations of both shifts are not shown but are obvious. This method has existing analogs in conventional optics.

Less obvious is the capability of this two mirror system M1 and M2 to allow some adjustment of the Xphase and Zphass errors at the mask during exposure scanning, independently, allowing independent control of (gap dependent) printing distortion in the vertical and horizontal directions. This capability is an important feature of this invention.

Xphase adjustments may be made by modifications of the location of collimating mirror M1 (along and/or perpendicular to the beam path), mirror grazing angle, or combinations thereof. Changes in Zphase usually accompany the changes in Xphase produced, most noticeably in the mean value of the Xphase at the top and bottom of the exposure field while changes in Zphase in the horizontal direction are much smaller, often negligible.

FIG. 1B shows the second mirror M2 of FIG. 1A making a linear vertical shift vertical to the path of x-ray beam 19 with mirror M2 moving to higher position M2' along the direction of scan 21 with x-ray beam 19 reflecting twice, at different times, from the collimating mirror M2, M2' as top and bottom beams 20 and 22 corresponding to the respective positions of mirror M2, M2'.

FIG. 1C shows the second mirror M2 of FIG. 1A making a linear shift parallel to the path of x-ray beam 19 with mirror M2'' moving along the direction of scan 23 to position M2''' with x-ray beam 19 reflecting from the collimating mirror M2'',M2''' as top and bottom beams 20' and 22' corresponding to the respective positions of mirror M2'', M2'''.

Figure 2A:
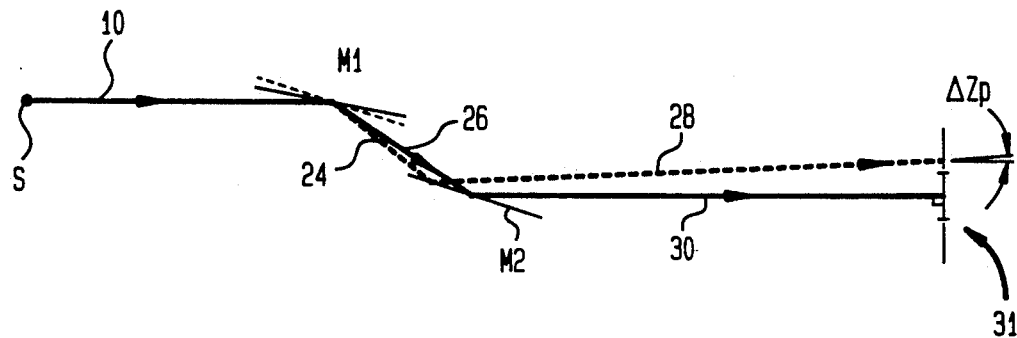
FIGS. 2A and 2B show the Zphase error introduced by altering the grazing angle of a collimating first mirror M1 with Zphase correction by a second flat mirror M2.
Figure 2B:
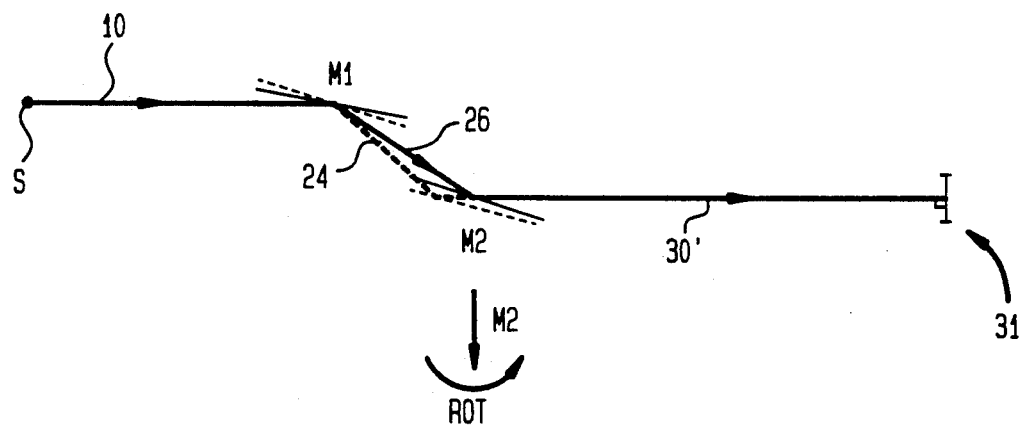

FIGS. 2A and 2B show the Zphase error introduced by altering the grazing angle of the collimating first mirror M1 with Zphase correction by the second flat mirror M2. By altering the grazing angle of the flat mirror M1 and shifting the mirror M1 as shown in FIGS. 2A and 2B, the mean Zphase of the rays 28, 30 in FIG. 2A and 30' in FIG. 2B arriving at the mask may be altered to a desired value, usually zero. In FIG. 2B, exposure scanning is accomplished by shifting the mirror M2 as shown in FIGS. 1A-1C. By this method the Zphase errors introduced by modifying the first mirror M1 are reduced to only the small horizontal component.

Figure 3:
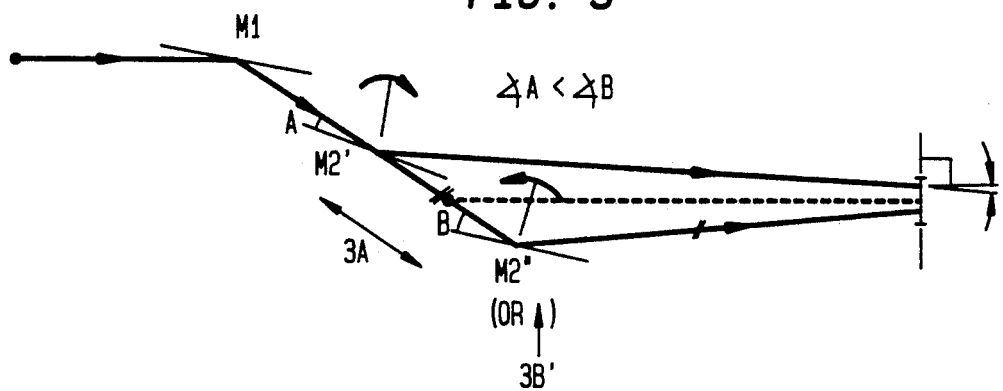
FIG. 3 illustrates altering the grazing angle of the flat mirror M2 between positions M2' and M2" while it is scanned so a deliberate Zphase error may be introduced at the mask.

FIG. 3 illustrates altering the grazing angle of the flat mirror M2 between positions M2' and M2'' while it is scanned so a deliberate Zphase error may be introduced at the mask. This error is introduced solely by the second flat mirror M2.

The distortion correction capability of this system is primarily a function of the gap and the specific design of the first, collimating, mirror. Typically, increasing the source to mirror distance for the first mirror allows larger phase changes to be made with position modification before adverse image effects are noted, such as nonlinear Xphase within the exposure field, or unacceptably large Zphase errors in the horizontal direction for a given Xphase error. Increasing the source to mirror distance also reduces the flux gathered from the source per unit length of horizontal exposure field, reducing throughput. These effects are engineering trade-offs, and performance of the scanning operations is not degraded by the scanning second mirror. The introduction of a second reflecting surface into the beam path reduces the flux available for exposure, requiring longer exposure times, and yielding lower system throughput.

While this invention has been described in terms of the above embodiment(s), those skilled in the art will recognize that the invention can be practiced with modifications within the spirit and scope of the appended claims.

Having thus described the invention, what is claimed as new and desirable and desired to be secured by Letters Patent is as follows:

1. Apparatus for exposure of lithography mask which employs radiation from an x-ray beam comprising:
   (a) a first, entrance collimating mirror in the path of said beam with a reflecting surface which is (concave) along its width and (concave) along its length, positioned to receive the fan of radiation from a synchrotron at a grazing angle and to collimate the X-rays,
   (b) a second, flat grazing incidence mirror positioned to receive the X-rays reflected from the entrance mirror at a grazing angle, said second mirror having a reflecting surface maintained at predetermined angles, and
   (c) means for controlling the direction of incidence of said x-rays upon said mask.

2. Apparatus in accordance with claim 1 wherein said means for controlling the direction of incidence of the x-rays upon said mask comprise means for linearly shifting said second mirror to scan said mask by linear shifting of said second mirror.

3. Apparatus in accordance with claim 2 wherein said means for controlling the direction of incidence of the x-rays upon said mask include means for altering the grazing angle of said second mirror during said linear shifting of said second mirror to alter vertical (z) axis phase errors.

* * * * *